United States Patent
Tower et al.

(10) Patent No.: US 8,289,060 B2
(45) Date of Patent: Oct. 16, 2012

(54) PULSED STATE RETENTION POWER GATING FLIP-FLOP

(75) Inventors: Samuel J. Tower, Austin, TX (US); Matthew S. Berzins, Cedar Park, TX (US); Charles A. Cornell, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 226 days.

(21) Appl. No.: 11/766,880

(22) Filed: Jun. 22, 2007

(65) Prior Publication Data
US 2008/0315932 A1 Dec. 25, 2008

(51) Int. Cl.
*H03K 3/00* (2006.01)
(52) U.S. Cl. ...................................... 327/218; 327/215
(58) Field of Classification Search ........... 327/215–219
See application file for complete search history.

(56) References Cited

U.S. PATENT DOCUMENTS

| | | | | |
|---|---|---|---|---|
| 6,639,827 | B2 * | 10/2003 | Clark et al. | 365/154 |
| 6,989,702 | B2 * | 1/2006 | Ko et al. | 327/203 |
| 2005/0253640 | A1 * | 11/2005 | Kim | 327/218 |
| 2006/0197571 | A1 | 9/2006 | Kim | |
| 2007/0001731 | A1 * | 1/2007 | Branch et al. | 327/218 |

* cited by examiner

*Primary Examiner* — Lincoln Donovan
*Assistant Examiner* — Diana J Cheng
(74) *Attorney, Agent, or Firm* — Yudell Isidore Ng Russell PLLC

(57) ABSTRACT

A flip-flop includes a functional latch and a retention latch. The functional latch is configured to maintain a logic state of the flip-flop in a power-up mode and the retention latch is configured to maintain the logic state of the flip-flop in a power-down mode. The retention latch is selectively coupled to the functional latch and the retention latch is configured to maintain the logic state in the power-down mode irrespective of a level of an associated clock signal when the power-down mode is entered. A clock pulse that clocks the flip-flop is derived from the associated clock signal.

18 Claims, 5 Drawing Sheets

_US 8,289,060 B2_

PULSED STATE RETENTION POWER GATING FLIP-FLOP

BACKGROUND

1. Field

This disclosure relates generally to a flip-flop and, more specifically, to a pulsed state retention power gating flip-flop.

2. Related Art

State retention power gating (SRPG) is a technique employed in flip-flops to reduce static leakage current by powering down certain components of the flip-flop during periods of inactivity. Reducing power consumption of electronic devices during periods of inactivity is commonly employed in battery-powered devices, such as mobile telephone handsets. Conventional SRPG flip-flop configurations have saved a logic state ('0' or '1') of an SRPG flip-flop in a retention latch prior to power-down. A common flip-flop configuration is a master-slave configuration in which a master latch feeds a slave latch. At least one conventional SRPG flip-flop configuration has maintained power to the slave latch (to preserve a current logic state) when other components of the SRPG flip-flop, including the master latch, are power-gated (i.e., power is removed from the master latch and other components). In general, the slave latch (which has acted as a retention latch and has remain powered during a power-down condition) has consumed a non-significant amount of static leakage current in the power-down state.

U.S. Pat. No. 7,164,301 (hereinafter "the '301 patent") discloses an imbalanced state retention power gating (SRPG) flip-flop that forces a known state upon power-up, depending upon the state being stored, to save additional static leakage current. More specifically, the '301 patent discloses removing power from a slave latch (in addition to an associated master latch) that is in a predetermined state prior to power-down to save additional static leakage current in the power-down state.

With reference to FIG. 1, a conventional non-pulsed SRPG flip-flop 100 is illustrated. The flip-flop 100 includes a retention latch 130, which includes inverters 102 and 104 and pass gates 106 and 108. First terminals of the pass gates 106 and 108 are coupled to an input of the inverter 102 and second terminals of the pass gates 106 and 108 are coupled to an output of the inverter 104. An output of the inverter 102 is coupled to an input of the inverter 104. The pass gate 108 is turned on when a clock (CPN) signal (which is an inverted version of a clock (CPI) signal) is in a high logic state and the pass gate 106 is turned on when a power-down (PD) signal is in a high logic state, i.e., when the flip-flop 100 is not in a deep sleep (power-down) mode. A first input of an inverting multiplexer 120 is configured to receive a data (D) signal and a second input of the multiplexer 120 is configured to receive a test input (TI) signal. A control input of the multiplexer 120 is configured to receive a test enable (TE) signal that, when asserted, selects the TI signal such that a scan function may be performed. An output of the multiplexer 120 is coupled to a first terminal of pass gate 118, which is turned on when the CPN signal is in a high logic state. A second terminal of the pass gate 118 is coupled to an input of inverter 116 and a first terminal of pass gate 114, which is turned on when the CPI signal is in a high logic state.

A second terminal of the pass gate 114 is coupled to an output of an inverter 112, whose input is coupled to an output of the inverter 116. An input of inverter 122 is coupled to the output of the inverter 116 and the input of the inverter 112. A functional latch 140 is formed by the inverters 112 and 116 and the pass gate 114. An output of the inverter 122 is coupled to a first terminal of a pass gate 124, which is turned on when the CPI signal is in a high logic state. A second terminal of the pass gate 124 is coupled to a drain of n-channel metal-oxide semiconductor field-effect transistor (MOSFET) 128, an input of an inverter 126, and a first terminal of pass gate 110, which is turned on when the PDN signal is in a high logic state. A second terminal of the pass gate 110 is coupled to an input of the inverter 102. In general, the flip-flop 100 has a relatively high CPI pulse high time requirement. Moreover, the flip-flop 100 requires the maintenance of multiple signals (i.e., the CPN and PDN signals) when the flip-flop 100 is in a power-down mode, requires that the CPN signal be in a certain state when entering and exiting the power-down mode, and employs a relatively large number of devices in a speed path (data input (D) to data output (Q) path) which causes the flip-flop 100 to have a relatively high propagation delay.

In general, pulsed SRPG flip-flops are designed to reduce a speed path delay by reducing the number of components in the speed path of a flip-flop. For example, U.S. Patent Application Publication No. 2006/0197571 (hereinafter "the '571 application") discloses a multi-threshold complementary metal-oxide semiconductor (MTCMOS) pulsed SRPG flip-flop that includes a scan function that is input into a retention latch of the flip-flop to, apparently, reduce the number of components in the speed path of the flip-flop. As is known, an MTCMOS circuit usually employs low threshold voltage (general power (GP)) CMOS transistors to implement a desired function during normal operation (power-up) mode and high threshold voltage (low power (LP)) CMOS transistors to reduce leakage current during a sleep (power-down) mode. In general, the pulsed SRPG flip-flops disclosed in the '571 application have a relatively high leakage current when in a power-down mode, require the maintenance of multiple signals when in a power-down mode, and require that a clock signal be in a high logic state when going into power-down in order to save a current state of the flip-flop in a retention latch.

What is needed is a pulsed state retention power gating flip-flop that exhibits lower leakage currents when in a power-down state.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Figure 1:
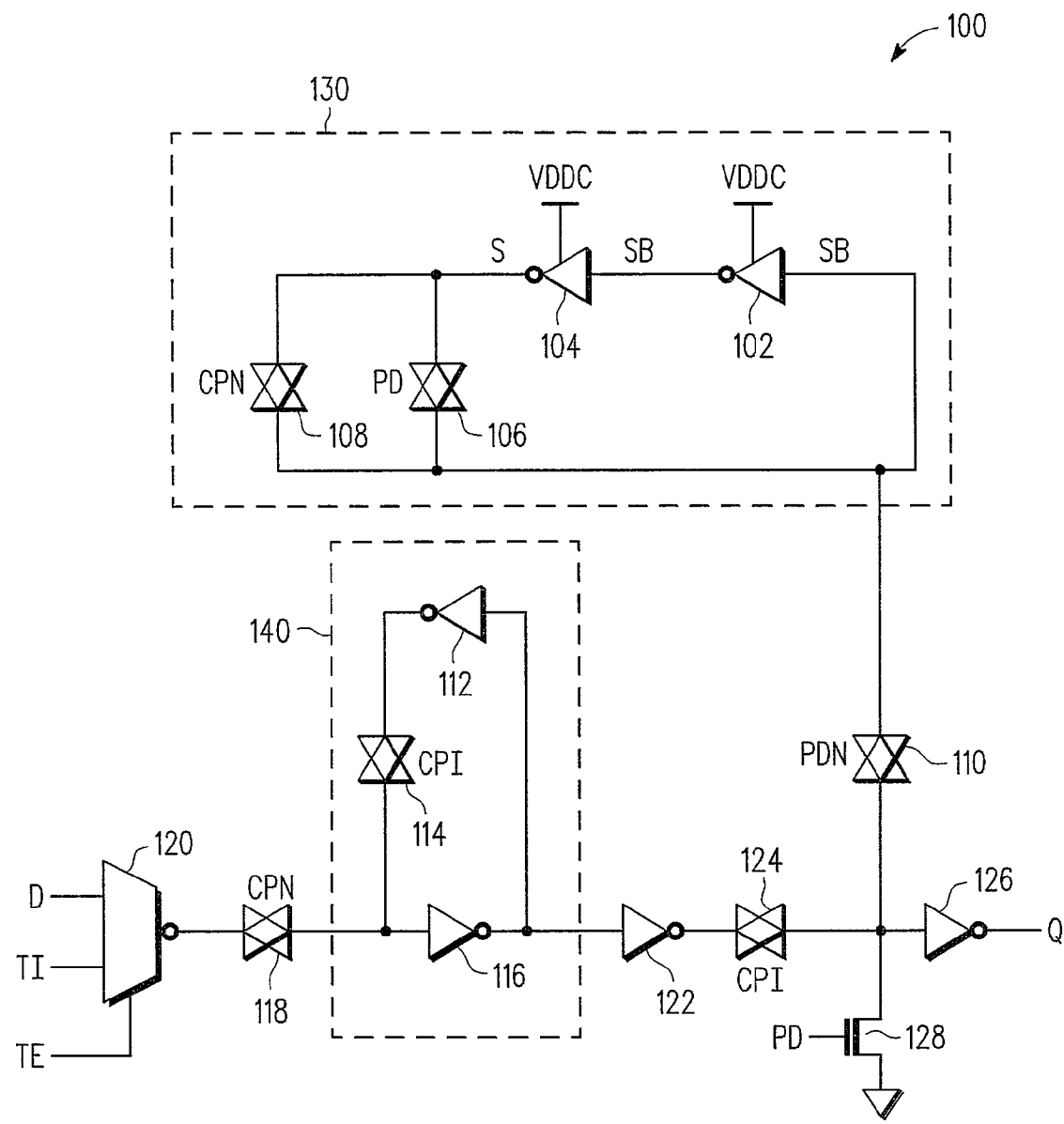
FIG. 1 is an electrical block diagram of a non-pulsed state retention power gating (SRPG) flip-flop, configured according to the prior art.

In the following detailed description of exemplary embodiments of the invention, specific exemplary embodiments in which the invention may be practiced are described in sufficient detail to enable those skilled in the art to practice the invention, and it is to be understood that other embodiments may be utilized and that logical, architectural, programmatic, mechanical, electrical and other changes may be made without departing from the spirit or scope of the present invention. The following detailed description is, therefore, not to be taken in a limiting sense, and the scope of the present invention is defined only by the appended claims and their equivalents. In particular, although the preferred embodiment is described below in conjunction with a processor system of a subscriber station, such as a cellular handset, it will be appreciated that the present invention is not so limited and may be embodied in a variety of functional blocks included within various devices, e.g., personal digital assistants (PDAs), digital cameras, portable storage devices, audio players, computer systems, and portable gaming devices, for example. As is used herein, the term "coupled" includes a direct connection between elements (devices) and an indirect connection between elements (devices) achieved with one or more intervening elements (devices). The terms "latch" and "flip-flop," as used herein, are interchangeable.

Various embodiments of the present disclosure are directed to a pulsed state retention power gating (SRPG) flip-flop that has a relatively low leakage current (equal to or less than about 143 pA) while in a power-down state and a relatively low number of gates in a speed path (D input to Q output) of the flip-flop. The flip-flop has a relatively low (e.g., 100 pS) setup-time plus clock-to-Q time, which is particularly advantageous in higher frequency applications (e.g., 1 GHz and higher frequencies). While the disclosed flip-flops have a hold-time requirement of approximately 150 pS (due to the nature of how a pulse is generated), the flip-flops may be advantageously employed in signals paths that have setup-time issues but do not have hold-time issues. In general, the only limitations on minimum pulse width are that the minimum pulse width be wide enough to ensure that data is properly written to a functional latch of the flip-flop and that an input clock signal does not prematurely turn off a NAND gate that is used to generate the pulse (see FIGS. 4 and 5). In at least one embodiment, the SRPG flip-flop implements a scan function and in this embodiment the SRPG flip-flop includes three stages (a multiplexer, a pass gate, and an inverter) in the speed path. In another embodiment, the SRPG flip-flop does not implement a scan function and in this embodiment the SRPG flip-flop includes two stages (a pass gate and an inverter) in the speed path. A pulsed SRPG flip-flop, configured according to various embodiments of the present disclosure, does not appreciably increase area, size, or power requirements on a chip in which the pulsed SRPG flip-flop is employed. In various embodiments, each device in the speed path of the flip-flop can be a high-speed device (e.g., a general power (GP) low threshold voltage device) without negatively impacting leakage currents when the flip-flop is in a power-down mode (due to the fact that the high-speed devices are not powered in the power-down mode). The GP devices may be, for example, high voltage threshold (HVT) or standard voltage threshold (SVT) GP devices.

In various embodiments, the SRPG flip-flop includes a functional latch and a retention latch. In general, the retention latch employs low power (LP) devices to reduce leakage current when the flip-flop in a power-down mode. The LP devices may be, for example, HVT or SVT LP devices. Data is transferred between the retention latch and the functional latch using contention. That is, when data is written from the functional latch to the retention latch, GP devices in the functional latch over power weaker low power (LP) devices in the retention latch. When data is written from the retention latch to the functional latch, secondary steering switches (e.g., metal-oxide semiconductor field-effect transistors (MOSFETs)) are employed to aid the LP devices in the retention latch to over power the GP devices in the functional latch. In another embodiment, LP devices may be employed in both the retention latch and the functional latch. In this case, transfer of data between a functional latch and a retention latch may also be achieved using contention by employing different size devices, by employing different voltage threshold devices, or by employing both different size devices and different voltage threshold devices.

In one embodiment, data is continuously written from the functional latch to the retention latch. In another embodiment, the retention latch is only written prior to entering a power-down mode, which generally reduces operating power requirements. In at least one embodiment, the flip-flop utilizes two control signals (i.e., a write (W) signal and a read (RD) signal) to transfer data between the functional and retention latches. In one embodiment, only the W signal is maintained while the flip-flop is in the power-down mode. While the discussion herein is directed to the use of n-channel and p-channel MOSFETs, it should be appreciated that in many applications any type of switches, e.g., bipolar junction transistors (BJTs), may be employed in various applications. Moreover, in various applications, the channel type of the MOSFET employed may be changed. More generally, the MOSFET devices may be thought of as insulated gate FETs (IGFETS).

According to one aspect of the present disclosure, a flip-flop includes a functional latch and a retention latch. The functional latch is configured to maintain a logic state of the flip-flop in a power-up mode and the retention latch is configured to maintain the logic state of the flip-flop in a power-down mode. The retention latch is selectively coupled to the functional latch and the retention latch is configured to maintain the logic state in the power-down mode irrespective of a level of an associated clock signal when the power-down mode is entered. A clock pulse (that clocks the flip-flop) is derived from the associated clock signal.

According to another aspect of the present disclosure, a method of operating a flip-flop includes receiving a first indication that a functional latch of the flip-flop is to enter a power-down mode. In this embodiment, the functional latch includes first devices. Data is transferred from the functional latch to a retention latch of the flip-flop prior to entering the power-down mode. The retention latch includes second devices that are over-powered by the first devices to effect the transfer of the data from the functional latch to the retention latch. Following the transfer of the data from the functional latch to the retention latch, the functional latch and the retention latch are disconnected and power is removed from the functional latch.

According to yet another embodiment, a processor system includes a processor register that includes a memory element. The memory element includes a functional latch and a retention latch. The functional latch is configured to maintain a logic state of the memory element in a power-up mode. The retention latch is configured to maintain the logic state of the memory element in a power-down mode. The retention latch is selectively coupled to the functional latch and the retention latch is configured to maintain the logic state in the power-down mode irrespective of a level of an associated clock signal when the power-down mode is entered.

Figure 2:
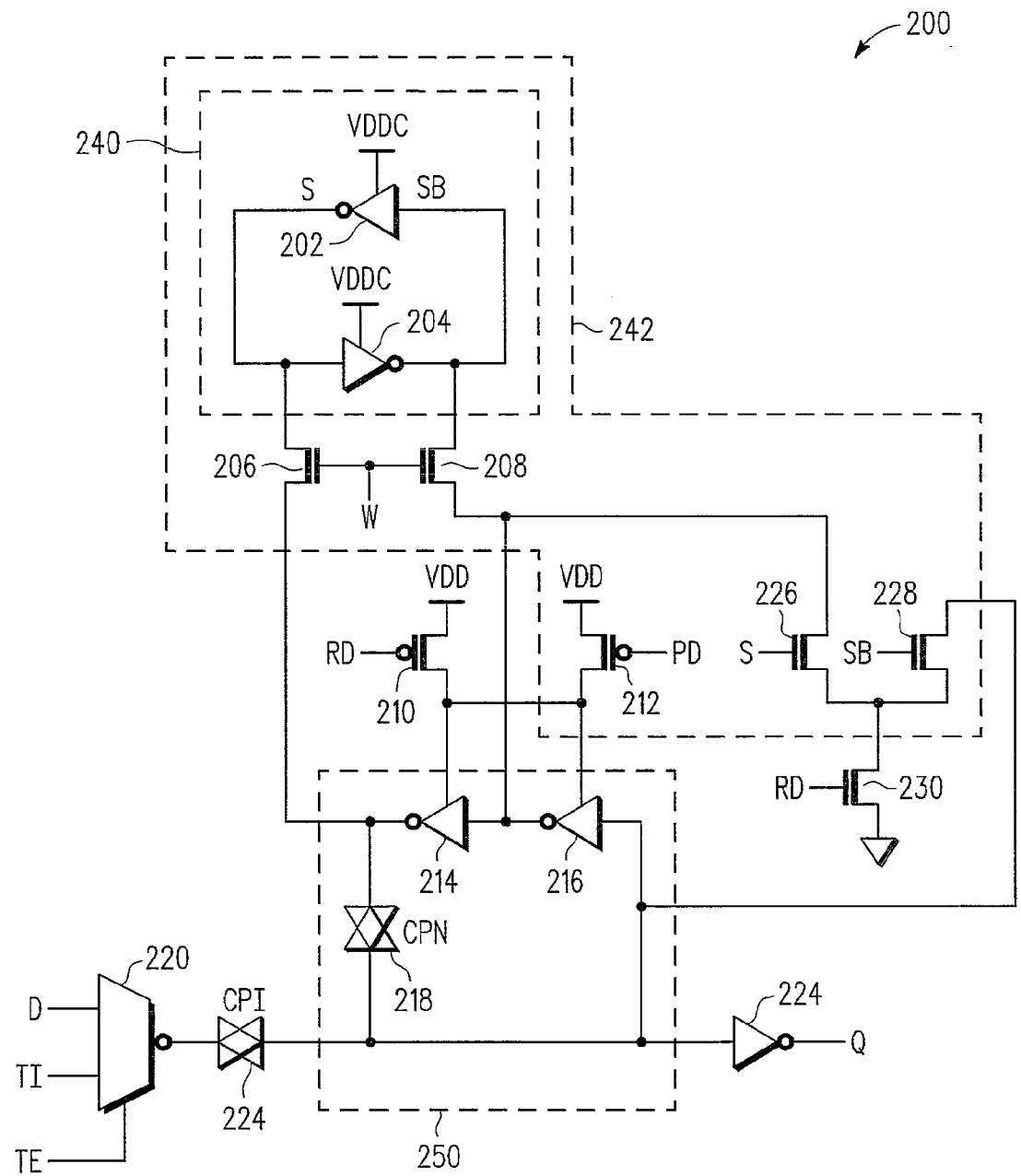
FIG. 2 is an electrical block diagram of a pulsed SRPG flip-flop, configured according to one embodiment of the present disclosure.

With reference to FIG. 2, a pulsed state retention power gating (SRPG) flip-flop 200, which is configured according to an embodiment of the present disclosure, is illustrated. The flip-flop 200 includes a retention latch 240, a functional latch 250, and a pulse generator (not shown specifically in FIG. 2) that provides two clock (CPN and CPI) signals (see FIGS. 4 and 5). The retention latch includes inverters 202 and 204, which are powered by a continuous power supply (VDDC) when power is removed from other components of the flip-flop 200 during a power-down mode. An input of the inverter 202 is coupled to an output of the inverter 204 and an input of the inverter 204 is coupled to an output of the inverter 202. A first terminal (drain) of a first switch (n-channel MOSFET) 206 is coupled to the input of the inverter 204 and a second terminal (source) of the switch 206 is coupled to an output of inverter 214 and a first terminal of pass gate 218. A first terminal (drain) of a second switch (n-channel MOSFET) 208 is coupled to the output of the inverter 204 and a second terminal (source) of the switch 208 is coupled to an output of inverter 216, an input of the inverter 214, and a first terminal (drain) of switch (n-channel MOSFET) 226.

Control terminals (gates) of the switches 206 and 208 are configured to receive a write (W) signal, which dictates whether the retention latch 240 is coupled to the functional latch 250, which includes the inverters 214 and 216 and the pass gate 218. The W signal may be maintained in an asserted state during normal operation of the flip-flop 200 or may be maintained in a non-asserted state until just prior to power-down. In this case, the W signal is asserted just prior to power-down to write a value of the functional latch 250 to the retention latch 240. The W signal is then maintained in a non-asserted state during the power-down mode to reduce leakage currents and isolate the functional latch 250 from the retention latch 240. In at least one embodiment, the devices in block 242 are low power (LP) devices and the devices not in block 242 are general power (GP) devices. However, as noted above, different size devices, different voltage threshold devices, or both different size devices and different voltage threshold devices may be implemented in the functional latch 250 and the retention latch 240 to achieve the same functionality. A second terminal (source) of the switch 226 is coupled to a second terminal (source) of a switch (n-channel MOSFET) 228 and a first terminal (drain) of switch (n-channel MOSFET) 230. A second terminal (source) of the switch 230 is coupled to a common point (e.g., ground) and a control terminal (gate) of the switch 230 is configured to receive a read (RD) signal that is asserted when data is read out of the retention latch 240 and into the functional latch 250.

The switches 226 and 228 function as steering switches that facilitate writing from the retention latch 240 (which employs LP devices) to the functional latch (which employs GP devices, in at least one embodiment). A first terminal (drain) of the switch 228 is coupled to an input of the inverter 216, an input of the inverter 224, and second terminals of pass gates 218 and 222. A control terminal (gate) of the switch 226 is coupled to the output of the inverter 202 and a control terminal (gate) of the switch 228 is coupled to the input of the inverter 202. An inverting multiplexer 220 includes a first input that is configured to receive a data (D) signal, a second input that is configured to receive a test in (TI) signal, and a select input that is configured to receive a test enable (TE) signal, which, when asserted, selects the TI signal for implementing a scan function. An output of the multiplexer 220 is coupled to a first terminal of the pass gate 222 and an output of the inverter 224 provides an output (Q) signal. The pass gate 222 is turned on when a clock (CPI) signal is in a high logic state and the pass gate 218 is turned on when a clock (CPN) signal is in a high logic state. The CPI signal is in a high logic state when the CPN signal is in a low logic state and the CPI signal is in a low logic state when the CPN signal is in a high logic state. As such, the pass gate 218 is turned on when the pass gate 222 is turned off and the pass gate 218 is turned off when the pass gate 222 is turned on.

In various implementations, the pass gate 218 may be omitted (i.e., replaced with a short). The inverter 214 is coupled to a power supply (VDD) via a switch (p-channel MOSFET) 210. More specifically, a first terminal (drain) of the switch 210 is coupled to the power supply VDD and a second terminal (source) of the switch 210 is coupled to a power input terminal of the inverter 214. When the flip-flop 200 enters a power-down mode the power supply VDD is removed, e.g., goes to zero volts. A control terminal (gate) of the switch 210 is configured to receive a read (RD) signal, which is in a low logic state during normal operation of the flip-flop 200 and is in a high logic state when the data in the retention latch 240 is read into the functional latch 250. The inverter 216 is coupled to the power supply VDD via a switch (p-channel MOSFET) 212. More specifically, a first terminal (drain) of the switch 212 is coupled to the power supply VDD and a second terminal (source) of the switch 212 is coupled to a power input terminal of the inverter 216. A control terminal (gate) of the switch 212 is configured to receive a power-down (PD) signal, which is in a low logic state during normal operation of the flip-flop 200 and is in a high logic state when the flip-flop 200 is in a power-down mode. The second terminals of the switches 210 and 212 are coupled together and, as such, the inverters receive power from the power supply VDD whenever either the RD or PD signals are in a low logic state, assuming that the power supply VDD is configured to provide power.

Figure 3:
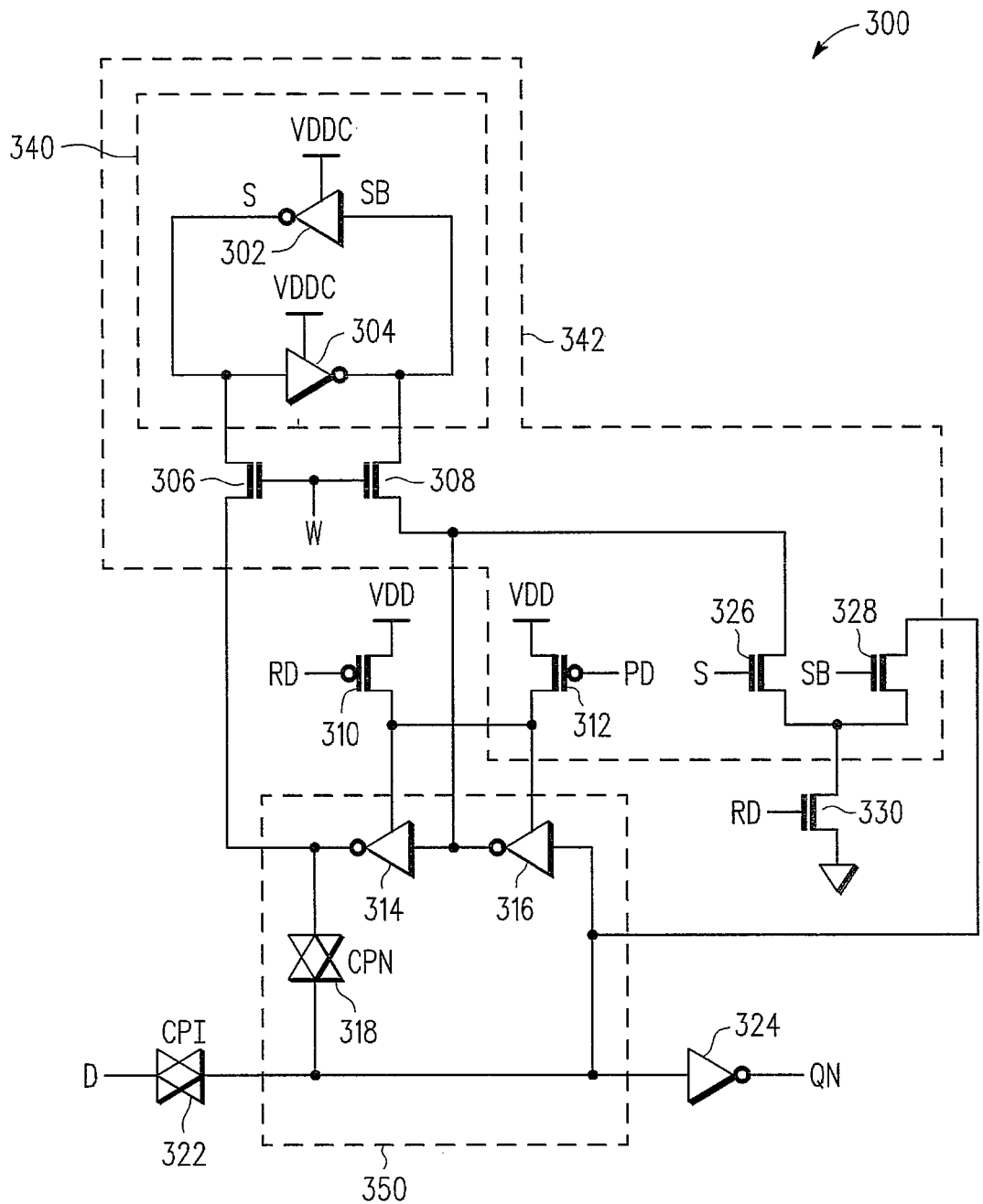
FIG. 3 is an electrical block diagram of a pulsed SRPG flip-flop, configured according to another embodiment of the present disclosure.

With reference to FIG. 3, a pulsed state retention power gating (SRPG) flip-flop 300, which is configured according to another embodiment of the present disclosure, is illustrated. The flip-flop 300 is similar to the flip-flop 200, except that the flip-flop 300 does not implement a scan function (i.e., does not include an input multiplexer). The flip-flop 300 includes a retention latch 340, a functional latch 350, and a pulse generator (not shown specifically in FIG. 3) that provides two clock (CPN and CPI) signals (see FIGS. 4 and 5). The retention latch includes inverters 302 and 304, which are powered by a continuous power supply (VDDC) when power (supplied by power supply VDD) is removed from other components of the flip-flop 300 during power-down. An input of the inverter 302 is coupled to an output of the inverter 304 and an input of the inverter 304 is coupled to an output of the inverter 302. A first terminal (drain) of a first switch (n-channel MOSFET) 306 is coupled to the input of the inverter 304 and a second terminal (source) of the switch 306 is coupled to an output of inverter 314 and a first terminal of pass gate 318. A first terminal (drain) of a second switch (n-channel MOSFET) 308 is coupled to the output of the inverter 304 and a second terminal (source) of the switch 308 is coupled to an output of inverter 316, an input of the inverter 314, and a first terminal (drain) of switch (n-channel MOSFET) 326.

Control terminals (gates) of the switches 306 and 308 receive a write (W) signal, which dictates whether the retention latch 340 is coupled to the functional latch 350, which includes the inverters 314 and 316. The W signal may be maintained in an asserted state during normal operation of the flip-flop 300 or may be maintained in a non-asserted state until just prior to power-down. In this case, the W signal is asserted just prior to power-down to write a value of the functional latch 350 to the retention latch 340. The W signal is then maintained in a non-asserted state during the power-down mode to reduce leakage currents. In this embodiment, the devices in block 342 are low power (LP) devices and the devices not in block 342 are, in at least one embodiment, general power (GP) devices. A second terminal (source) of the switch 326 is coupled to a second terminal (source) of a switch (n-channel MOSFET) 328 and a first terminal (drain) of switch (n-channel MOSFET) 330. A second terminal (source) of the switch 330 is coupled to a common point (e.g., ground) and a control terminal (gate) of the switch 330 receives a read (RD) signal that is asserted when data is read out of the retention latch 340 and into the functional latch 350.

In various implementations, the pass gate 318 may be replaced with a short. The inverter 314 is coupled to the power supply VDD via a switch (p-channel MOSFET) 310. More specifically, a first terminal (drain) of the switch 310 is coupled to the power supply VDD and a second terminal (source) of the switch 310 is coupled to a power input terminal of the inverter 314. A control terminal (gate) of the switch 310 is configured to receive a read (RD) signal, which is in a low logic state during normal operation of the flip-flop 300 and is in a high logic state when the data in the retention latch 340 is read into the functional latch 350. The inverter 316 is coupled to the power supply VDD via a switch (p-channel MOSFET) 312. More specifically, a first terminal (drain) of the switch 312 is coupled to the power supply VDD and a second terminal (source) of the switch 312 is coupled to a power input terminal of the inverter 316. A control terminal (gate) of the switch 312 is configured to receive a power-down (PD) signal, which is in a low logic state during normal operation of the flip-flop 300 and is in a high logic state when the flip-flop 300 is in a power-down mode. The second terminals of the switches 310 and 312 are coupled together.

The switches 326 and 328 function as steering switches that facilitate writing from the retention latch 340 (which employs LP devices) to the functional latch (which employs GP devices, in at least one embodiment). A first terminal (drain) of the switch 328 is coupled to an input of the inverter 316, an input of the inverter 324, and second terminals of pass gates 318 and 322. A control terminal (gate) of the switch 326 is coupled to the output of the inverter 302 and a control terminal (gate) of the switch 328 is coupled to the input of the inverter 302. A first terminal of the pass gate 322 is configured to receive a data (D) signal and an output of the inverter 324 provides an output (QN) signal. In this embodiment, the pass gate 322 is turned on when the CPI signal is in a high logic state and the pass gate 318 is turned on when the CPN signal is in a high logic state. The CPI signal is in a high logic state when the CPN signal is in a low logic state and the CPI signal is in a low logic state when the CPN signal is in a high logic state. As such, the pass gate 318 is turned on when the pass gate 322 is turned off and the pass gate 318 is turned off when the pass gate 322 is turned on.

Figure 4:
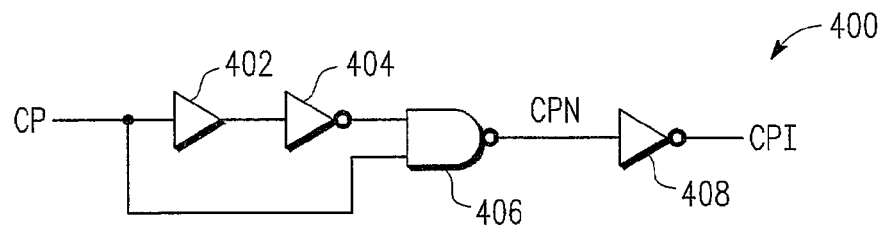
FIG. 4 is an electrical block diagram of a pulse generator that may be employed in the pulsed SRPG flip-flops of FIGS. 2 and 3.

FIG. 4 shows a pulse generator 400 that includes a buffer 402, a NAND gate 406, and inverters 404 and 408. An input of the buffer 402 is configured to receive a clock (CP) signal and an output of the buffer 402 is coupled to an input of the inverter 404. An output of the inverter 404 is coupled to a first input of the NAND gate 406 and a second input of the NAND gate 406 is configured to receive the CP signal. An output of the NAND gate 406 provides the CPN signal and is coupled to an input of the inverter 408. An output of the inverter 408 provides the CPI signal. It should be appreciated that a pulse width of the CPI signal is dictated by a difference in propagation delay (attributable to the buffer 402 and the inverter 404) between the signals provided at the first and second inputs of the NAND gate 406. The pulse width of the CP signal can be virtually any length, providing that the CP signal does not prematurely cause the NAND gate 406 to turn off (i.e., the pulse width of the CP signal should be wider than the propagation delay through buffer 402 and the inverter 404).

Figure 5:
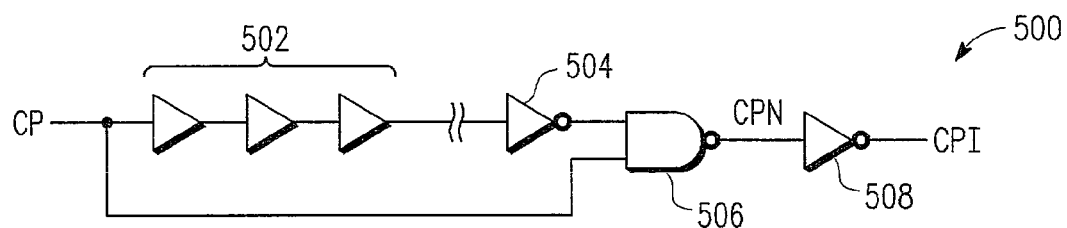
FIG. 5 is an electrical block diagram of another pulse generator that may be employed in the pulsed SRPG flip-flops of FIGS. 2 and 3.

FIG. 5 shows a pulse generator 500 that includes a buffer chain 502, a NAND gate 506, and inverters 504 and 508. An input of the buffer chain 502 is configured to receive a clock (CP) signal and an output of the buffer 502 is coupled to an input of the inverter 504. An output of the inverter 504 is coupled to a first input of the NAND gate 506 and a second input of the NAND gate 506 is configured to receive the CP signal. An output of the NAND gate 506 provides the CPN signal and is coupled to an input of the inverter 508. An output of the inverter 508 provides the CPI signal. It should be appreciated that a pulse width of the CPI signal is dictated by a difference in propagation delay (attributable to the buffer chain 502 and the inverter 504) between the signals provided at the first and second inputs of the NAND gate 506. The pulse width of the CP signal can also be virtually any length, providing that the CP signal does not prematurely cause the NAND gate 506 to turn off (i.e., the pulse width of the CP signal should be wider than the propagation delay through buffer chain 502 and the inverter 504). It should be appreciated that the pulse generators 400 and 500 may be configured to receive other signals, e.g., a reset signal, an enable signal, and a set signal, which are considered well within the level of one of ordinary skill in the art, based on the present disclosure.

Figure 6:
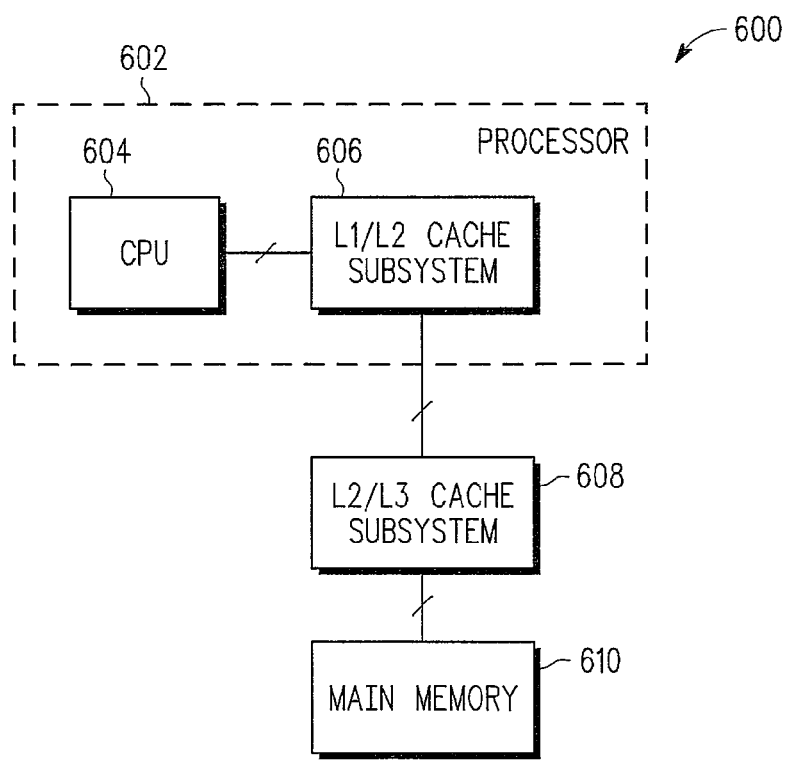
FIG. 6 is an electrical block diagram of an example processor system that may employ one or more pulsed SRPG flip-flops (configured according to FIGS. 2 and 3) in a processor path.

FIG. 6 depicts an exemplary processor system 600 that includes a processor 602 having at least one central processing unit (CPU) core 604 coupled to an on-chip level 1/level 2 (L1/L2) cache subsystem 606. The processor 602 is configured to execute an application appropriate software system (e.g., an operating system and one or more applications). The subsystem 606 is coupled to an off-chip cache subsystem 608, which may include L2 and/or level 3 (L3) cache, depending upon the architecture of the processor 602. For example, the processor 602 may include both L1 and L2 cache on-chip. In this case the subsystem 608 may only incorporate L3 cache. As another example, the processor 602 may only include L1 cache, in which case the subsystem 608 may include both L2 and L3 cache. In either case, the cache subsystem 608 is coupled to the main memory 610. In a typical embodiment, the L1, L2 and L3 cache each comprise an application appropriate amount of static random access memory (SRAM) and the main memory comprises an application appropriate amount of dynamic random access memory (DRAM). The CPU 604 may also include registers (memory elements) which may be configured according to various aspects of the present disclosure. More specifically, the registers of the CPU 604 or various paths of the CPU 604 may include memory elements configured in a similar manner to the flip-flop 200 of FIG. 2 or the flip-flop 300 of FIG. 3. The flip-flops disclosed herein may be encoded within one or more design files (e.g., design files for a processor integrated circuit) on one or more computer readable storage media, e.g., compact disk read-only memory (CD-ROM), etc.

Figure 7:
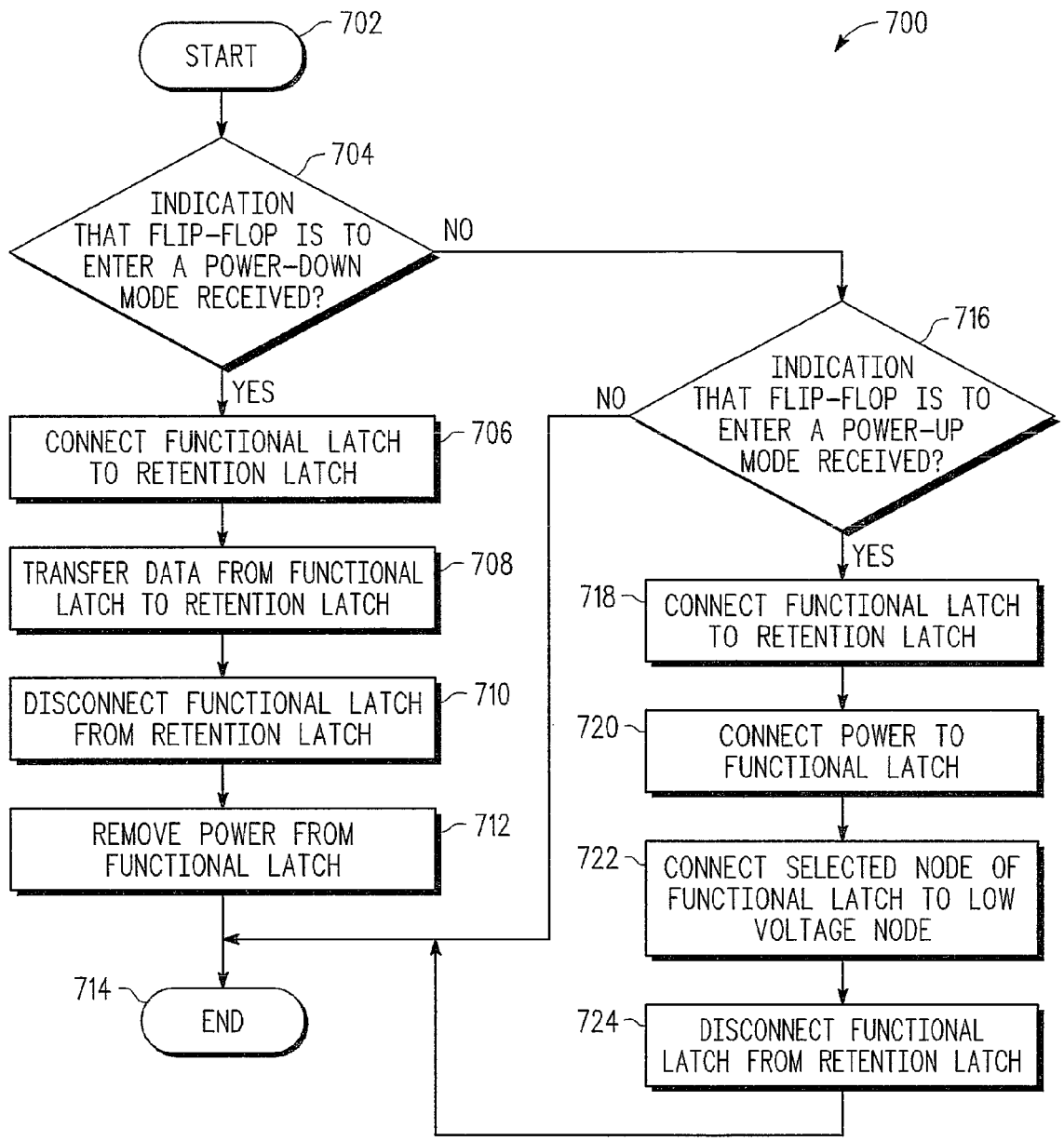
FIG. 7 is an example flow chart of a process for powering down and powering up devices of a flip-flop, configured according to various embodiments of the present disclosure.

With reference to FIG. 7, a process 700 is illustrated for powering up and powering down devices of a memory element (e.g., a flip-flop), which may be configured according to various embodiments of the present disclosure. Without loss of generality, the process 700 is described in conjunction with the flip-flop 200 of FIG. 2. In block 702 the process 700 is initiated, at which point control transfers to decision block 704. In block 704, it is determined whether a first indication (that the functional latch 250 of the flip-flop 200 is to enter a power-down mode) is received. If the first indication is received in block 704, control transfers to block 706, where the functional latch 250 of the flip-flop 200 is connected (using the switches 206 and 208) to a retention latch 240 of the flip-flop 200. Next, in block 708, data is transferred from the functional latch 250 to the retention latch 240, prior to entering the power-down mode. In this case, the retention latch 240 includes second devices that are over-powered by first devices of the functional latch 250 to effect the transfer of the data from the functional latch 250 to the retention latch 240. Then, in block 710, the functional latch 250 is disconnected (using the switches 206 and 208) from the retention latch 240 (following the transfer of the data from the functional latch 250 to the retention latch 240). Next, in block 712, power is removed (e.g., the power supply VDD is disabled) from the functional latch 250. From block 712, control transfers to block 714, where the process 700 terminates until another event is detected.

In block 704, when the first indication is not received, control transfers from block 704 to decision block 716. In block 716, it is determined whether a second indication that the functional latch 250 is to enter a power-up mode is received. If the second indication is not received in block 716, control transfers to block 714. If the second indication is received in block 716, control transfers to block 718, where the functional latch 250 is connected (using the switches 206 and 208) to the retention latch 240. Next, in block 720, power is provided to the functional latch 250. Then, in block 722, a selected node of the functional latch 250 is connected to a low voltage node using a steering switch (including the switches 226, 228 and 230) to facilitate transfer of the data from the retention latch 240 to the functional latch 250. In this case, the selected node is based on the data stored in the retention latch 240. Following block 722, control transfers to block 724, where the functional latch 250 is disconnected from the retention latch 240 following the transfer of the data from the retention latch 240 to the functional latch 250, and then to block 714.

Accordingly, a number of techniques have been disclosed herein that generally provide a pulsed state retention power gating flip-flop that has reduced leakage current when in a power-down state.

As used herein, a software system can include one or more objects, agents, threads, subroutines, separate software applications, two or more lines of code or other suitable software structures operating in one or more separate software applications, on one or more different processors, or other suitable software architectures.

As will be appreciated, the processes in preferred embodiments of the present invention may be implemented using any combination of computer programming software, firmware or hardware. As a preparatory step to practicing the invention in software, the computer programming code (whether software or firmware) according to a preferred embodiment will typically be stored in one or more machine readable storage mediums such as fixed (hard) drives, diskettes, optical disks, magnetic tape, semiconductor memories such as read-only memories (ROMs), programmable ROMs (PROMs), etc., thereby making an article of manufacture in accordance with the invention. The article of manufacture containing the computer programming code is used by either executing the code directly from the storage device, by copying the code from the storage device into another storage device such as a hard disk, random access memory (RAM), etc., or by transmitting the code for remote execution. The method form of the invention may be practiced by combining one or more machine-readable storage devices containing the code according to the present disclosure with appropriate standard computer hardware to execute the code contained therein. An apparatus for practicing the techniques of the present disclosure could be one or more computers and storage systems containing or having network access to computer program(s) coded in accordance with the present disclosure.

Although the invention is described herein with reference to specific embodiments, various modifications and changes can be made without departing from the scope of the present invention as set forth in the claims below. For example, the flip-flops disclosed herein may be broadly employed in various devices, e.g., subscriber stations, of wireless communication systems. Accordingly, the specification and figures are to be regarded in an illustrative rather than a restrictive sense, and all such modifications are intended to be included with the scope of the present invention. Any benefits, advantages, or solution to problems that are described herein with regard to specific embodiments are not intended to be construed as a critical, required, or essential feature or element of any or all the claims.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A flip-flop, comprising:
   a functional latch configured to maintain a logic state of the flip-flop in a power-up mode;
   a retention latch configured to maintain the logic state of the flip-flop in a power-down mode, wherein true and complementary data values are transferred concurrently from the functional latch to the retention latch to minimize a required transfer time, and wherein the flip-flop is a pulsed state retention power gating flip-flop;
   first and second switches configured to selectively couple the functional latch to the retention latch responsive to a first control signal, wherein the first control signal is asserted to connect the functional latch and the retention latch for data transfer, and wherein the first control signal is deasserted to disconnect the functional latch and the retention latch; and
   a read circuit coupled to the functional latch, wherein the read circuit is configured to transfer data from the retention latch to the functional latch when a read signal is asserted, a power-down signal is deasserted, and the first control signal is asserted.

2. The flip-flop of claim 1, wherein the retention latch only includes low power devices.

3. The flip-flop of claim 1, wherein the retention latch includes two low power inverters.

4. The flip-flop of claim 1, wherein the functional latch only includes general power devices.

5. The flip-flop of claim 1, wherein the functional latch includes two general power inverters.

6. The flip-flop of claim 1, wherein a speed path of the flip-flop only includes a multiplexer, a pass gate, and an inverter.

7. The flip-flop of claim 1, wherein a speed path of the flip-flop only includes a pass gate and an inverter.

8. The flip-flop of claim 1, further comprising:
   a pulse generator configured to provide a clock pulse for clocking the flip-flop.

9. The flip-flop of claim 1, wherein a speed path of the flip-flop does not include more than two devices.

10. A processor system, comprising:
a processor register, the processor register including a memory element, the memory element comprising:
a functional latch configured to maintain a logic state of the memory element in a power-up mode;
a retention latch configured to maintain the logic state of the memory element in a power-down mode, wherein the logic state is transferred to the retention latch from the functional latch using a dual-ended write mode transfer, and wherein the functional latch and the retention latch function as a pulsed state retention power gating flip-flop;
first and second switches configured to selectively couple the functional latch to the retention latch responsive to a first control signal, wherein the first control signal is asserted to connect the functional latch and the retention latch for data transfer, and wherein the first control signal is deasserted to disconnect the functional latch and the retention latch; and
a read circuit coupled to the functional latch, wherein the read circuit is configured to transfer data from the retention latch to the functional latch when a read signal is asserted, a power-down signal is deasserted, and the first control signal is asserted.

11. The processor system of claim 10, wherein the retention latch includes two low power inverters.

12. The processor system of claim 10, wherein the functional latch includes two general power inverters.

13. The processor system of claim 10, wherein a speed path of the memory element only includes a pass gate and an inverter.

14. A flip-flop, comprising:
a functional latch configured to maintain a logic state of the flip-flop in a power-up mode;
a retention latch configured to maintain the logic state of the flip-flop in a power-down mode, wherein the retention latch is selectively coupled to the functional latch and true and complementary data values are transferred concurrently from the functional latch to the retention latch to minimize a required transfer time, and wherein the flip-flop is a pulsed state retention power gating flip-flop and a speed path of the flip-flop includes only two devices; and
a read circuit coupled to the functional latch, wherein the read circuit is configured to transfer data from the retention latch to the functional latch when a read signal is asserted, a power-down signal is deasserted, and the first control signal is asserted.

15. The flip-flop of claim 14, wherein the retention latch includes two low power inverters.

16. The flip-flop of claim 14, wherein the functional latch includes two general power inverters.

17. The flip-flop of claim 14, further comprising:
a pulse generator configured to provide a clock pulse for clocking the flip-flop.

18. The flip-flop of claim 14, further comprising:
first and second switches configured to selectively couple the functional latch to the retention latch responsive to a first control signal, wherein the first control signal is asserted to connect the functional latch and the retention latch for data transfer, and wherein the first control signal is deasserted to disconnect the functional latch and the retention latch.

* * * * *